(12) United States Patent
Lim et al.

(10) Patent No.: US 9,064,778 B2
(45) Date of Patent: Jun. 23, 2015

(54) METHOD OF MANUFACTURING THIN FILM TRANSISTOR

(71) Applicant: KOREA INSTITUTE OF SCIENCE AND TECHNOLOGY, Seoul (KR)

(72) Inventors: Jung Ah Lim, Gyeonggi-do (KR); Yong-Won Song, Daejeon (KR); Jae-Min Hong, Seoul (KR); Won-Kook Choi, Seoul (KR); Dae Seong Eom, Chungcheongbuk-do (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/259,674

(22) Filed: Apr. 23, 2014

(65) Prior Publication Data

US 2015/0072482 A1 Mar. 12, 2015

(30) Foreign Application Priority Data

Sep. 10, 2013 (KR) ........................ 10-2013-0108576

(51) Int. Cl.
*H01L 29/49* (2006.01)
*H01L 29/16* (2006.01)
*H01L 29/66* (2006.01)
*H01L 21/02* (2006.01)
*H01L 29/45* (2006.01)
*H01L 29/43* (2006.01)

(52) U.S. Cl.
CPC ...... *H01L 29/1606* (2013.01); *H01L 29/66969* (2013.01); *H01L 21/02527* (2013.01); *H01L 21/02227* (2013.01); *H01L 29/4908* (2013.01); *H01L 29/43* (2013.01); *H01L 29/458* (2013.01)

(58) Field of Classification Search
CPC .............. H01L 21/02227; H01L 29/40; H01L 2924/1011; H01L 2924/102; H01L 2924/1082; H01L 2924/1304; H01L 2924/13069
See application file for complete search history.

(56) References Cited

U.S. PATENT DOCUMENTS

| 7,838,933 | B2 | 11/2010 | Chabinye et al. |
| 8,058,113 | B2 | 11/2011 | Chabinye et al. |
| 8,445,320 | B2 | 5/2013 | Avouris et al. |
| 2012/0080658 | A1* | 4/2012 | Yang et al. ........................ 257/9 |

FOREIGN PATENT DOCUMENTS

| JP | 2008-160122 A | 7/2008 |
| JP | 5-098159 B2 | 10/2012 |
| KR | 10-1190219 B1 | 10/2012 |
| KR | 1020130011966 A | 1/2013 |
| KR | 1020130012642 A | 2/2013 |
| KR | 1020130027195 A | 3/2013 |

OTHER PUBLICATIONS

Seoung-Ki Lee, et al; "All Graphene-Based Thin Film Transistors on Flexible Plastic Substrates", Nano Letters, vol. 12, pp. 3472-3476; Published Jun. 11, 2012.
Felice Torrisi, et al; "Inkjet-Printed Graphene Electronics", ACSNANO; vol. 6, No. 4, pp. 2992-3006; Published online Mar. 9, 2012.

* cited by examiner

*Primary Examiner* — Cheung Lee
(74) *Attorney, Agent, or Firm* — Ladas & Parry LLP

(57) ABSTRACT

A method of manufacturing a thin-film transistor is provided, including preparing ink including a solution in which a graphene oxide, a reduced graphene oxide, or a combination thereof is dispersed, forming the ink on a substrate in the form of a pattern, and forming a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

21 Claims, 11 Drawing Sheets

Room temperature

70°C

150°C

METHOD OF MANUFACTURING THIN FILM TRANSISTOR

CROSS-REFERENCE TO RELATED APPLICATION

This application claims priority to and the benefit of Korean Patent Application No. 10-2013-0108576 filed in the Korean Intellectual Property Office on Sep. 10, 2013, the entire contents of which are incorporated herein by reference.

BACKGROUND OF THE INVENTION (a) Field of the Invention

The present invention relates to a method of manufacturing a thin film transistor.

(b) Description of the Related Art

In general, since various electronic devices such as a display device, a light-emitting diode, and a solar cell transmit light to form an image or generate power, the electronic devices require a transparent conductive film capable of transmitting light. As the transparent conductive film, indium tin oxide (ITO) has been widely used.

However, as the consumption amount of indium is increased, economic efficiency of the indium tin oxide may be deteriorated due to high cost. Particularly, since the transparent conductive film including the indium has a chemical and electrical defect, a transparent conductive material that can replace the transparent conductive film is needed.

As such a transparent conductive material, graphene has attracted attention. The graphene is a material made of a honeycomb carbon lattice having a one-atom thickness, and since the graphene has high electrical conductivity and transparency, the graphene has attracted attention as an important material that can be applied to various future devices such as a semiconductor device, a solar cell, a supercapacitor, and a flexible display.

Accordingly, a method of effectively manufacturing and using graphene or a graphene oxide is needed, and studies on applying the graphene or the graphene oxide to various electronic devices are also needed.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method of manufacturing a single-process thin-film transistor.

An exemplary embodiment of the present invention provides a method of manufacturing a single-process thin-film transistor, including: preparing ink including a solution in which a graphene oxide, a reduced graphene oxide, or a combination thereof is dispersed; forming the ink on a substrate in the form of a pattern; and forming a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

The method of manufacturing a single-process thin-film transistor may further include reducing the graphene oxide within the formed source electrode, drain electrode, and semiconductor channel after the forming a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

In the reducing of the graphene oxide within the formed source electrode, drain electrode, and semiconductor channel, intense pulsed light may be used.

The method of manufacturing a single-process thin-film transistor may further include separating and cutting the source electrode and the drain electrode in the formed source electrode, drain electrode, and semiconductor channel.

In the preparing ink including a solution in which the graphene oxide, the solution in which the graphene oxide, the reduced graphene oxide, or the combination thereof is dispersed may include an organic solvent, water, or a combination thereof in which the graphene oxide, the reduced graphene oxide, or the combination thereof is dispersed.

The solution in which the graphene oxide, the reduced graphene oxide, or the combination thereof is dispersed may include 0.01 wt % to 3 wt % of graphene oxides, the reduced graphene oxide, or the combination thereof.

The organic solvent may be n-methyl pyrrolidone (NMP), dimethylpyrrolidone, ethylene glycol, acetone, tetrahydrofuran, acetonitrile, dimethylformamide, methanol, ethanol, propanol, dimethyl sulfoxide, chloroform, cyclopentanone, or a combination thereof.

The organic solvent, the water, or the combination thereof may include a first solvent and a second solvent, and the second solvent may have lower viscosity and surface tension than those of the first solvent, or may have higher viscosity and surface tension than those of the same.

In the forming of the ink on a substrate in the form of a pattern, a to method of selectively controlling wettability of the solution, an inkjet printing method, or a method using a dispenser may be used.

In the inkjet printing method, a volume of discharged ink may be 1 µl or less.

In the forming of a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern, the formed source electrode and drain electrode may have a thickness of 5 nm to 50 nm, and the formed semiconductor channel may have a thickness of 10 nm or less.

A difference between the thickness of source electrode and drain electrode and the thickness of the semiconductor channel may be 2 nm or more.

A distance between the source electrode and the drain electrode may be 20 µm to 200 µm.

The method of manufacturing a single-process thin-film transistor may further include removing a remaining solvent in the ink after the forming of a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

The intense pulsed light may have a pulse duration of 1 msec to 500 msec.

The intense pulsed light may have a pulse-off time of 0.1 msec to 500 msec.

The intense pulsed light may have energy of 5 J/cm$^2$ to 200 J/cm$^2$.

The substrate may include silicon, glass, an oxide, a nitride, a plastic, or a combination thereof.

In the inkjet printing method, a discharging rate may be 100 μm/s to 200 μm/s.

In the inkjet printing method, a discharge volume may be 1 μL or less, a discharging rate may be 1 Hz to 1000 Hz, and a temperature of the substrate may be 25° C. to 90° C.

The forming of a source electrode and a drain electrode that are positioned at edges of the pattern and a semiconductor channel positioned between the electrodes by a coffee-ring effect in the ink by using the graphene oxide, the reduced graphene oxide or the combination thereof within the formed pattern may include increasing the coffee-ring effect by heating the substrate on which the pattern is formed to improve an evaporating rate of the solvent from the ink.

In the method of selectively controlling wettability of the solution, the pattern may be formed by allowing the ink to soak into the pattern in which the surface energy is controlled, as a result of selectively controlling surface energy on the substrate in a regular pattern form.

According to an embodiment of the present invention, it is possible to provide a method of manufacturing a thin-film transistor capable of reducing cost, processing time, and occupying space by simplifying a process. More specifically, a photolithography process and a mask process may not be performed.

Further, the manufacturing method is an environmentally-friendly process, and may not use a photoresist or an etching solution.

Furthermore, efficiency of a material is excellent, unlike an existing spin coating method.

DETAILED DESCRIPTION OF THE EMBODIMENTS

Figure 1:
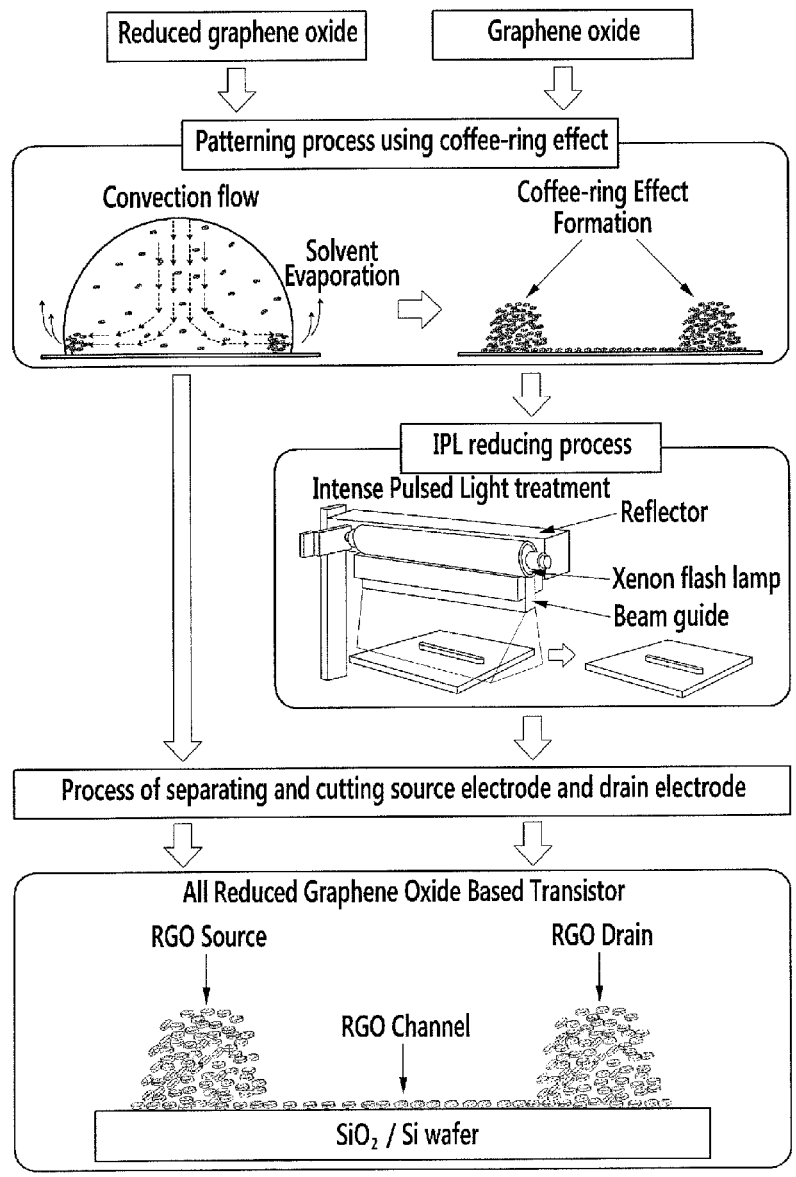
FIG. 1 is a schematic diagram for describing a method of manufacturing a thin-film transistor according to an exemplary example of the present invention.

Exemplary embodiments of the present invention will hereinafter be described in detail, and may be easily performed by those who are skilled in the related art. However, the present invention may be modified in various different ways, and it is not limited to the exemplary examples described herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a method of manufacturing a thin-film transistor according to an exemplary example of the present invention will be described with reference to the drawings.

An exemplary embodiment of the present invention provides a method of manufacturing a single-process thin-film transistor including: preparing ink including a solution in which a graphene oxide, a reduced graphene oxide, or a combination thereof is dispersed; forming the ink by discharging it on a substrate in the form of a pattern using an inkjet printing method; and forming a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

Further, the method of manufacturing a single-process thin-film transistor may further include reducing the graphene oxide within the formed source electrode, drain electrode, and semiconductor channel after the forming of a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

In the reducing the graphene oxide within the formed source electrode, drain electrode, and semiconductor channel, an intense pulsed light may be used. However, the present invention is not limited to the method.

Furthermore, the method of manufacturing a single-process thin-film transistor may further include separating and cutting the source electrode and the drain electrode in the formed source electrode, drain electrode, and semiconductor channel.

Such a method can be easily performed with a printing process or a pattern forming process, and can effectively obtain a desired channel width or shape.

For more specific description, a schematic diagram for describing a method of manufacturing a thin-film transistor according to an exemplary example of the present invention is illustrated in FIG. 1.

The method of manufacturing a thin-film transistor according to the exemplary example of the present invention can effectively manufacture a thin-film transistor by a single process by maximizing a coffee-ring effect caused by a print pattern process and an electrical characteristic of the reduced graphene oxide.

FIG. 1 schematically illustrates the coffee-ring effect.

The coffee-ring effect refers to a phenomenon in which fluid flow in which a solvent of the solution produced in a regular pattern by printing or various methods flows from a center of the solution toward an edge thereof due to a non-uniform evaporation rate of the solvent on a surface of the solution occurs, and thus a solute in the solution is thickly layered at an edge of a solution droplet to be formed in a ring shape.

Such a phenomenon is generally observed when a solution having low viscosity quickly evaporates on the substrate, and a distribution of the solute can be controlled by the coffee-ring effect by adjusting flow of the solvent. Particularly, the flow of the solvent can be adjusted using the evaporation rate of the solvent, wettability for the substrate, and a mixed solvent.

The graphene is a material made of a honeycomb carbon lattice having an one-atom thickness, and since the graphene has high electrical conductivity and an excellent physical property, the graphene has gained attention as an important material that can be applied to various future devices such as a high performance semiconductor device, a solar cell, a supercapacitor, a flexible display, a memory, a computer component having a thin-paper shape, and a nano-bio material. Since single-layer graphene has very high transparency of 97% or more and high mechanical strength, a performance loss thereof due to deformation is less incurred, and thus the graphene is highly likely to be applied to a flexible device in the future.

In order to replace the graphene having a difficulty in a solution process, the reduced graphene oxide may be used. The reduced graphene oxide may be manufactured by reducing the graphene oxide. Since the graphene oxide can be easily dispersed in water, the graphene oxide is appropriate for the solution process.

When the reduced graphene oxide is used, it is possible to manufacture a conductive thin film having mechanical stability and high transparency. However, since it is difficult to perfectly reduce the graphene oxide during the graphene oxide reducing process, the graphene oxide has lower conductivity and charge mobility than graphene manufactured by general growth.

Moreover, the reduced graphene oxide may have a semiconductor characteristic in which metallicity of high conductivity is changed by an electric field depending on a thickness of the thin film and a degree of reduction of the graphene oxide. When the thickness of the thin film is small (for example, less than 10 layers), a semiconductor characteristic in which symmetry of electrical interaction of carbon atoms is collapsed (A-B stacking) and is changed by the electric field is observed. In addition, when the thickness is large (for example, 10 layers or more), an electrical property of metallicity is observed due to high conductivity.

Since the method of manufacturing a thin-film transistor according to the exemplary example of the present invention is a single process in which the transistor is manufactured through the solution processing by using the graphene oxide, the reduced graphene oxide, or the combination thereof, and the graphene oxide is selectively reduced, it is possible to decrease a process time, an occupying space, and cost by simplifying the process. More specifically, an existing photolithography process and a mask process may not be performed. When the transistor is manufactured using only the reduced graphene oxide, the reducing process may also not be performed, so that it is possible to simplify the process.

Accordingly, since a photoresist and an etching solution are not used, it is possible to perform an environmentally-friendly process. Unlike a spin coating method that is mostly used, it is possible to improve efficiency of the material.

Further, when the graphene oxide is reduced using the intense pulsed light, it is possible to control a degree of reduction of the graphene oxide, and it is possible to manufacture the transistor without affecting an interface.

More specifically, in the prepared ink including a solution in which the graphene oxide, the reduced graphene oxide, or the combination thereof is dispersed, the ink solution may include an organic solvent, water, and a combination thereof in which the graphene oxide, the reduced graphene oxide, or the combination thereof is dispersed.

The organic solvent may be n-methyl pyrrolidone (NMP), dimethylpyrrolidone, ethylene glycol, acetone, tetrahydrofuran, acetonitrile, dimethylformamide, methanol, ethanol, propanol, dimethyl sulfoxide, chloroform, cyclopentanone, or a combination thereof.

In general, when a single solvent (for example water) is used, if an evaporation rate of the solvent is high, it is possible to maximize the coffee-ring effect. A solvent having low viscosity and high volatility may be used in order to maximize the coffee-ring effect, or the substrate may be heated in order to increase the evaporation rate of the solvent. Further, it is possible to obtain the same effect by improving wettability for the substrate.

As an example of the ink, ink in which the reduced graphene oxide is dispersed in the n-methyl pyrrolidone (NMP) may include 0.01 wt % to 3 wt % of reduced graphene oxides. More specifically, in this case, it is possible to effectively exhibit the coffee-ring effect by heating the substrate to a temperature of 60° C. or more.

In addition, water in which the graphene oxide is dispersed may include 0.01 wt % to 3 wt % of graphene oxides. In such a case, as a concentration thereof is low, the coffee-ring effect can be increased.

When the coffee-ring effect is controlled using the mixed solvent, if a second solvent having lower viscosity and surface tension than those of a first solvent is added, or having higher viscosity and surface tension than those of the same, it is possible to maximize the coffee-ring effect. This is a principle that controls flow of the solvent (Marangoni flow) induced due to a surface tension difference in the patterned solution to be directed from the center of the liquid droplet toward the edge thereof.

More specifically, in the forming the ink on a substrate in the form of a pattern, a method of selectively controlling wettability of the solution, an inkjet printing method, or a patterning method using a dispenser may be used. However, the present invention is not limited to the above-stated methods.

As an example of the method of selectively controlling wettability of the solution, when a UV-ozone process is performed on a surface having low surface energy (or hydrophobicity) through a mask, only a portion of the surface exposed to UV-ozone may selectively have high surface energy (or hydrophilicity). When the substrate on which the UV-ozone process has been performed is immersed in the ink and is then picked up, since the ink selectively soaks into the portion having high surface energy (or hydrophilicity), it is possible to exhibit a desired coffee-ring effect.

In the inkjet printing method, when the ink is discharged, a volume of an ink droplet may be 1 µl or less. It is possible to obtain a desired coffee-ring effect from the volume of the ink droplet. Further, in the inkjet printing method, a discharging rate may be 100 µm/s to 200 µm/s, but is not limited thereto.

In the forming of a source electrode and a drain electrode that are positioned at edges of the pattern and a semiconductor channel positioned between the electrodes by a coffee-ring effect in the ink by using the graphene oxide, the reduced graphene oxide or the combination thereof within the formed pattern, the formed source electrode, and drain electrode may have a thickness of 5 nm to 50 nm, and the formed semiconductor channel may have a thickness of 10 nm or less. However, a difference in thickness between the electrodes and the channel region may be 2 nm or more. Such a thickness difference may be adjusted depending on a configuration of a desired transistor, and the adjustment of the thickness may be achieved by adjusting the coffee-ring effect.

In addition, a distance between the source electrode and the drain electrode may be 20 μm to 200 μm, but is not limited thereto. The distance range may be adjusted by adjusting the coffee-ring effect like the thickness.

The method of manufacturing a single-process thin-film transistor may further include removing a remaining solvent in the ink after the forming of a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

In the removing a remaining solvent in the ink, a heat treatment method, a vacuum drying method, or a combination thereof may be used. It is possible to increase efficiency in the following reduction step using the intense pulsed light through the removing of a remaining solvent. As a specific example, the temperature in a heat treatment step may be 25° C. to 150° C. However, the present invention is not limited to the above-mentioned temperature.

As a specific example, the intense pulsed light may have a pulse duration of 1 msec to 500 msec. However, the present invention is not limited to the above-mentioned pulse duration time.

As another example, the intense pulsed light may have a pulse-off time of 0.1 msec to 500 msec. However, the present invention is not limited to the above-mentioned pulse-off time.

As still another example, the intense pulsed light may have energy of 5 J/cm$^2$ to 200 J/cm$^2$. However, the present invention is not limited to the above-mentioned energy.

The conditions of the intense pulsed light are merely examples, and may be adjusted depending on a desired effect.

The substrate may include, for example, silicon, glass, an oxide, a nitride, or a combination thereof. The substrate may be, for example, a silicon wafer. However, the present invention is not limited to the above-material.

The intense pulsed light may include, for example, a xenon flash lamp, a triggering/controlling circuit, a capacitor, a reflecting mirror, and an optical wavelength filter.

A quartz tube may be provided at a lamp housing for the xenon flash lamp, and a water-cooling supply path for cooling the lamp through water cooling may be provided together with a separate cooling device.

The optical wavelength filter may selectively filter a predetermined wavelength region, and may be changed depending on the kind and size of particles and the kind and size of the substrate.

In addition, a vertical distance adjuster, a horizontal substrate transferring device such as a conveyor belt, an auxiliary heating plate, an auxiliary cooling plate, and a beam guide may be provided.

The vertical distance adjuster may adjust a distance between the xenon flash lamp and the substrate, and the horizontal substrate transferring device such as the conveyor belt may facilitate a real-time process. The auxiliary heating plate and/or the auxiliary cooling plate are provided within the conveyor belt, so that it is possible to improve efficiency and quality of a sintering process. The beam guide can accurately control a path of light, and may be made of, for example, quartz.

The intense pulsed light may be controlled depending on a required condition of a light pulse, and may arbitrarily control, for example, a pulse duration time, a pulse-off time, a pulse number, a pulse peak intensity, and an average pulse energy.

The intense pulsed light may illuminate one time or multiple times, and conductivity may be controlled depending on the number of times of illuminating. For example, the number of times of illuminating of the intense pulsed light may be 1 to 99, and may be 3 to 20 within the range.

It is possible to obtain the reduced graphene oxide by separating oxygen atoms and/or a hydroxyl group existing in the graphene oxide by the illuminating of the intense pulsed light.

As described above, the intense pulsed light may reduce the graphene oxide within a short time. For this reason, since a chemical fluid such as a reducing agent is not used during the reducing process, a lower film or an adjacent pattern is not affected, and when the graphene oxide is used to manufacture the electrodes of the thin-film transistor, since the channel is not affected, it is possible to implement a favorable transistor characteristic. Furthermore, it is possible to control a degree of reducing the graphene oxide by controlling the energy of the intense pulsed light.

The reduced graphene oxide may have high electrical conductivity, charge mobility, and transparency similar to the graphene. For example, the reduced graphene oxide may have electrical conductivity of about 0.1 S/cm to 15 S/cm and sheet resistance of about 10 kΩ to 100 kΩ at a transparency of about 70% to 90%.

Hereinafter, examples and comparative examples of the present disclosure will be described. However, the examples described below are merely examples of the present disclosure, and the present disclosure is not limited to the examples.

Example 1

Preparation of Graphene Oxide Solution 25 mg of graphene oxides are obtained by oxidizing 1 g of graphite powder (Sigma Aldrich) by using 5 g of potassium permanganate. Subsequently, after 2.1 mg of graphene oxides are added to 3 ml of water, an ultrasonic wave process is performed on the resultant solution, and finally, a solution in which the graphene oxide is dispersed is prepared.

Manufacturing of Thin-Film Transistor Through Coffee-Ring Effect

Thereafter, the graphene oxide solution is deposited on the silicon wafer by using the method of selectively controlling the wettability of the solution or the inkjet printing method in order to form a pattern having a width of 50 to 200 μm.

In the method of selectively controlling wettability of the solution, in order to selectively control the wettability, a hydrophobic surface is first formed by self-assembled monolayers on a silicon wafer surface on which a silicon oxide with a thickness of 300 nm is layered, using octadecyltrichlorosilane.

When a desired pattern is formed on the surface on which the octadecyltrichlorosilane is formed through the UV-ozone process by using a mask, a portion of the pattern exposed to the UV-ozone becomes hydrophilic, where a functional group such as a carboxyl (—COOH), a hydroxyl (—OH), or an epoxide (C—O—C) is formed. When the substrate is immersed in the graphene oxide solution and is picked up, the ink is formed only on the hydrophilic pattern, and the solvent is evaporated. Accordingly, it is possible to obtain a pattern in which a coffee-ring is formed.

Figure 11:
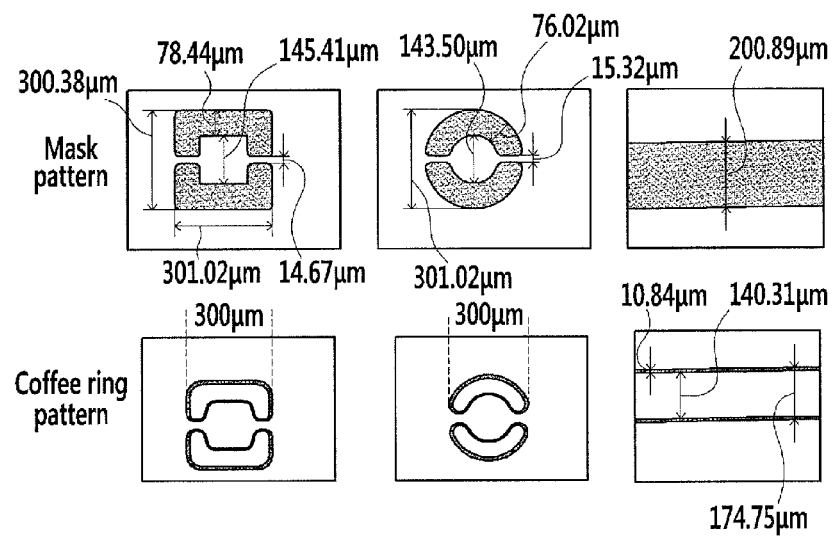
FIG. 11 illustrates photographs of various types of patterns other than a line pattern, which are formed through a method of selectively controlling wettability, and data obtained by analyzing thicknesses thereof.
Figure 11:
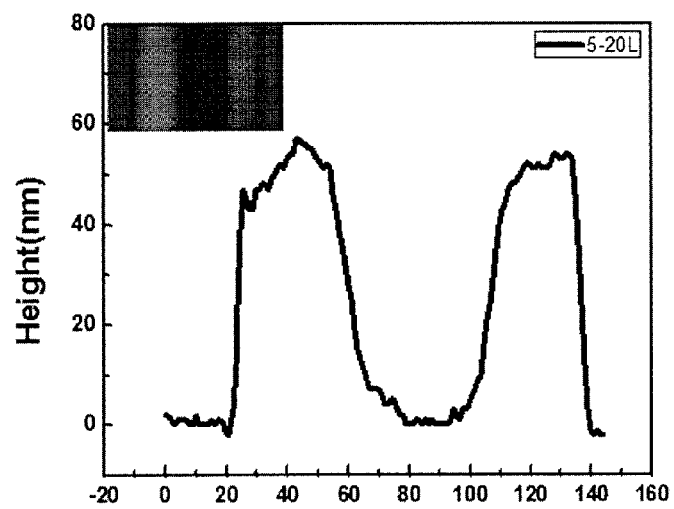

In the example, a pattern having a line width of 50 μm to 200 μm and a length of 7500 μm has been formed, but a shape of the pattern is not limited to the example. As a specific example, FIG. 11 illustrates photographs of various shapes of patterns other than the line pattern, which are formed by the method of selectively controlling wettability, and data obtained by analyzing thicknesses thereof.

When the inkjet printing method is used, in the example, the pattern is formed under a condition where a discharge volume is 10 pL to 30 pL, a discharging rate is 500 Hz, and a temperature of the substrate is 25° C.

Electrodes and a channel layer are formed using the graphene oxide by the coffee-ring effect in the pattern. A thickness of the formed electrodes is 7 nm to 10 nm, and a thickness of the channel layer is 1 nm to 3 nm.
Reduction Through Intense Pulsed Light Thereafter, after the silicon wafer is disposed within a glove box, the intense pulsed light of 30 pulses is illuminated on the graphene oxide pattern for an on-time of 2 msec and for an off-time of 35 msec at an energy amount of 71 J/cm$^2$. By doing this, a reduced graphene oxide thin-film transistor is manufactured.

Thereafter, a connected part of the source and the drain electrodes is cutted by adjusting a channel width using a cutting tip that is self-manufactured.

Figure 2:
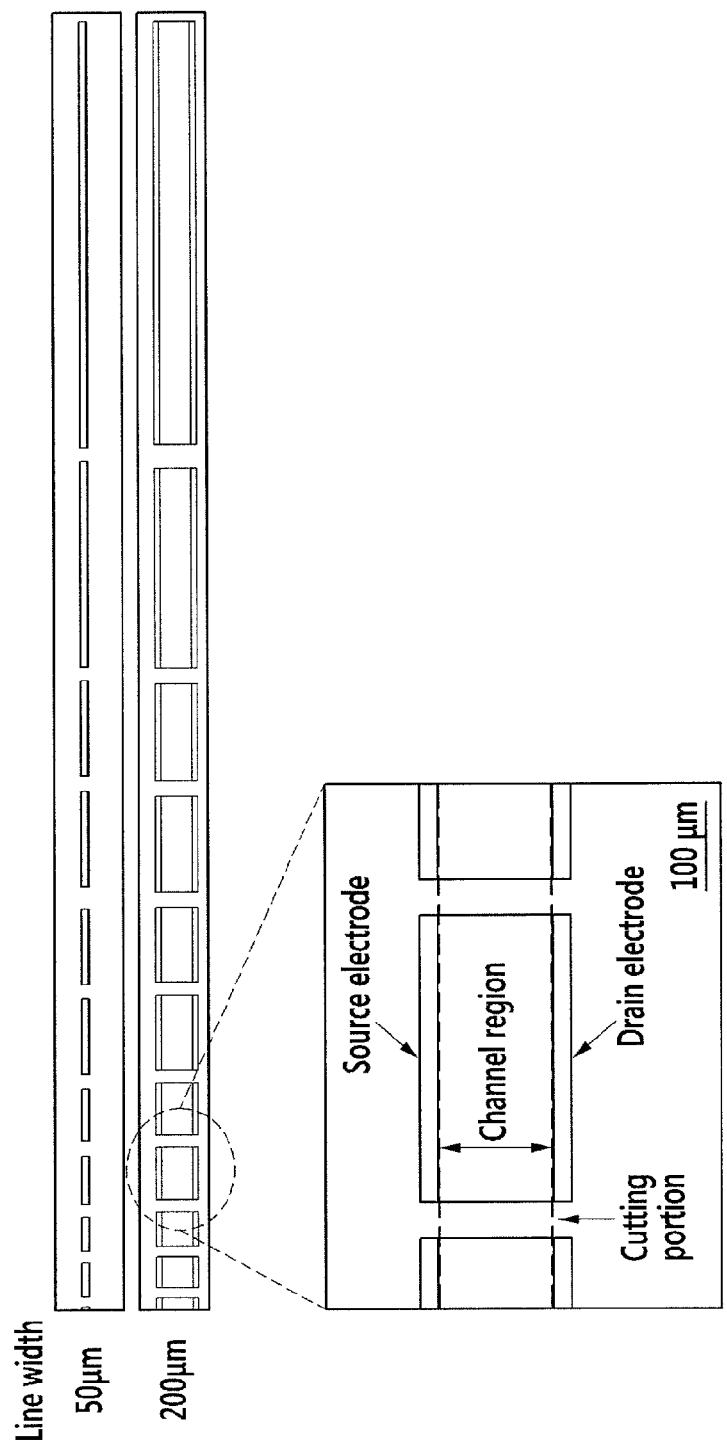
FIG. 2 illustrates a single-process graphene transistor using a coffee-ring effect.

FIG. 2 illustrates a single-process graphene transistor reduced using the intense pulsed light after the coffee-ring effect is induced by selectively controlling the wettability of the solution on the wafer.
Evaluation 1

The reduced graphene oxide pattern according to Example 1 is evaluated using X-ray photoelectron spectroscopy (XPS).

Figure 3:
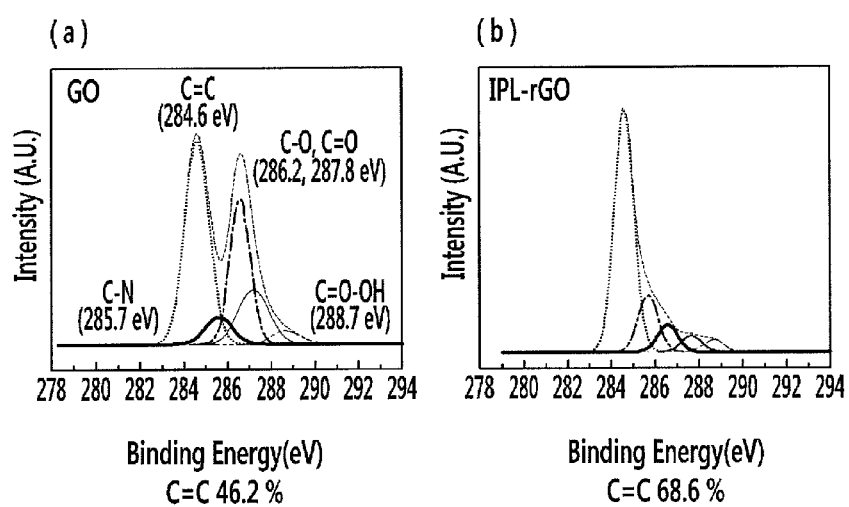
FIG. 3 illustrates XPS analysis results of C1s before and after processing a graphene oxide coffee-ring pattern according to Example 1 with intense pulsed light.

FIG. 3 illustrates XPS analyzing results of C1s before and after processing the graphene oxide with the intense pulsed light. It is confirmed that peaks related to C—O, C═O, and C(O)O are largely decreased, which means the graphene oxide is reduced.

Figure 4:
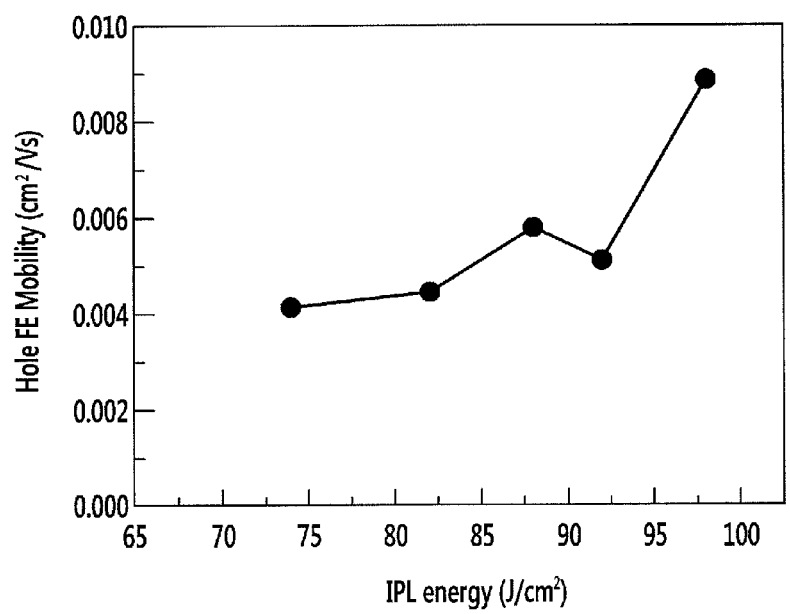
FIG. 4 is a graph illustrating electric field effect mobility of the graphene oxide single-process transistor according to Example 1 depending on processing conditions of the intense pulsed light.

FIG. 4 is a graph representing electric field effect mobility of the graphene oxide single-process transistor according to Example 1 depending on processing conditions of the intense pulsed light. It is confirmed that a degree of reducing the graphene oxide by using the intense pulsed light can be controlled.
Evaluation 2

A current characteristic of the thin-film transistor according to Example 1 is evaluated.

Figure 5:
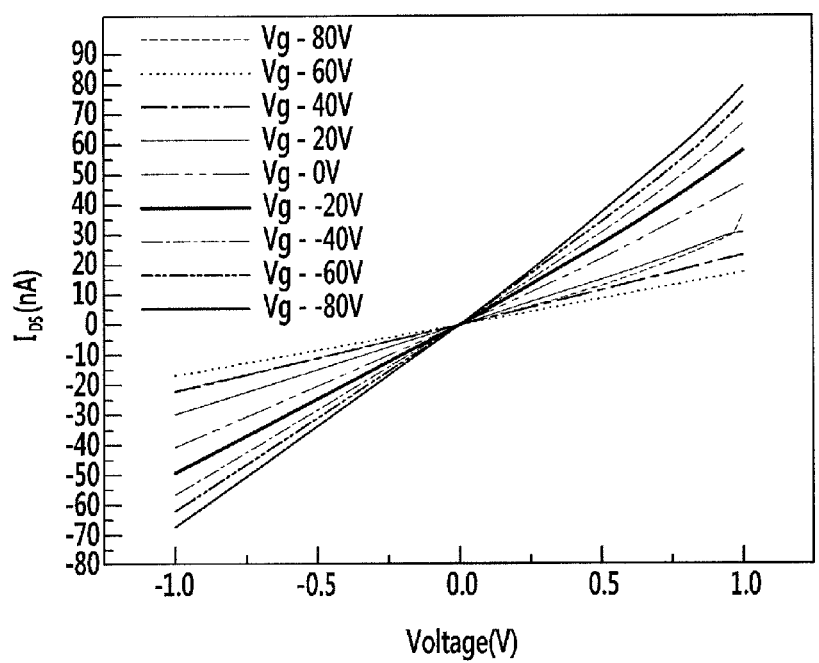
FIG. 5 is a graph exhibiting an output characteristic (IDS-VDS) of the thin-film transistor according to Example 1.

FIG. 5 is a graph exhibiting a current characteristic ($I_{DS}$-$V_{DS}$) of the thin-film transistor according to Example 1.

Figure 6:
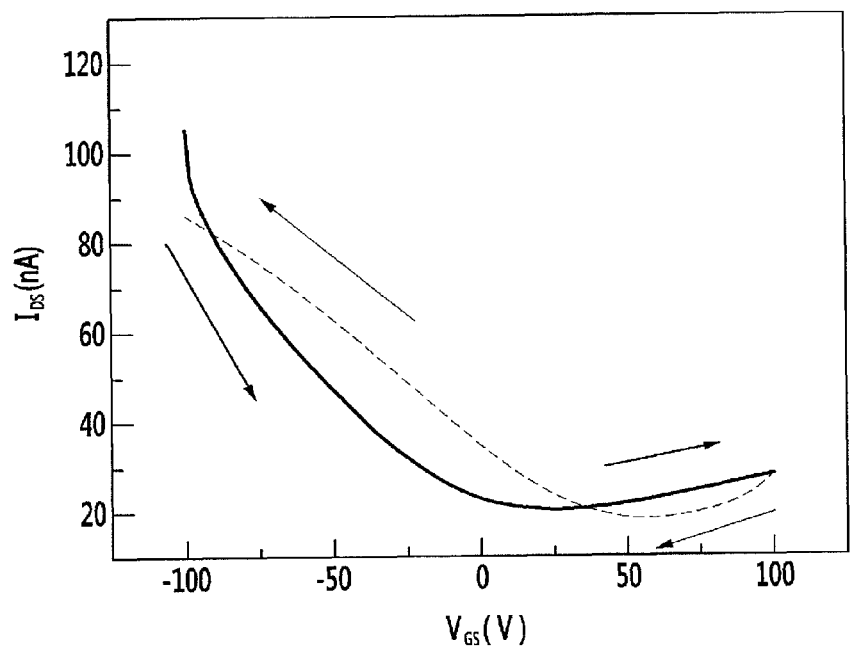
FIG. 6 is a graph exhibiting transfer characteristic (IDS-VGS) performance of the thin-film transistor manufactured according to Example 1.

FIG. 6 is a graph exhibiting transfer characteristic (IDS-VGS) performance of the thin-film transistor manufactured according to Example 1.

From this graph, it can be seen that a gate voltage of the manufactured thin-film transistor exhibits a transfer characteristic (ambipolar transport) of a typical graphene and is operated as a transistor. (Hole electric field effect mobility is 0.01 cm$^2$V$^{-1}$s$^{-1}$, electron electric field effect mobility is 0.001 cm$^2$V$^{-1}$s$^{-1}$, and an on/off ratio is 3.8)
Evaluation 3

Figure 7:
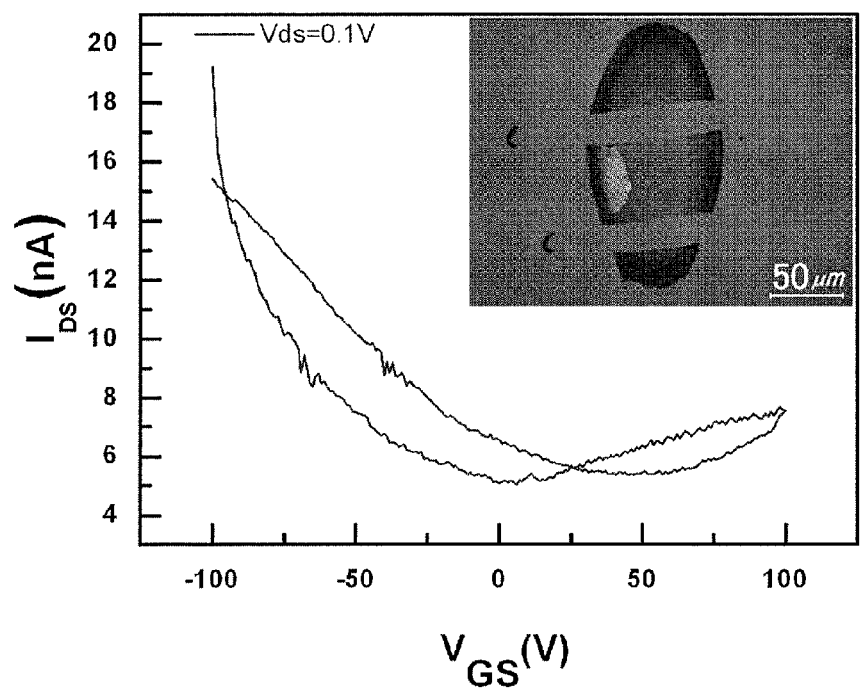
FIG. 7 is a graph exhibiting a transfer characteristic (IDS-VGS) and the inside of the single-process graphene transistor using an inkjet printing method according to Example 1.

FIG. 7 represents a graph exhibiting a transfer characteristic (IDS-VGS), and the inside of FIG. 7 is the single-process graphene transistor using the inkjet printing according to Example 1.

From the graph, it can be seen that a typical transfer characteristic (ambipolar transport) of a grapheme with regard to a gate voltage of the thin-film transistor manufactured according to Example 1. Thus, the thin-film transistor of Example 1 is operated as a transistor.

Example 2

A single-process transistor is manufactured using the reduced graphene oxide solution by the coffee-ring effect.
Preparation of Reduced Graphene Oxide Solution A hydrazine reducing agent is added to a solution in which the graphene oxide is dispersed to reduce the graphene oxide. A solution in which 0.1 wt % of reduced graphene oxides are dispersed in n-methylpyrrolidone (NMP) is prepared.
Manufacturing of Thin-Film Transistor Through Coffee-Ring Effect Subsequently, a pattern having a width of 200 μm is formed on the silicon wafer by using the reduced graphene oxide solution through the method (the same method as Example 1) of selectively controlling wettability of the solution. At this time, the substrate is heated to increase the evaporation rate of the solvent, so that it is possible to maximize the coffee-ring effect.
Evaluation 4

The coffee-ring effect of the patterned solution according to Example 2 depending on the temperature of the substrate is evaluated.

Figure 8:
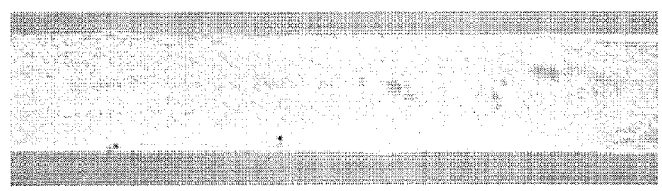
FIG. 8 illustrates a single-process transistor of a reduced graphene oxide (RGO) using a coffee-ring effect according to Example 2.
Figure 8:
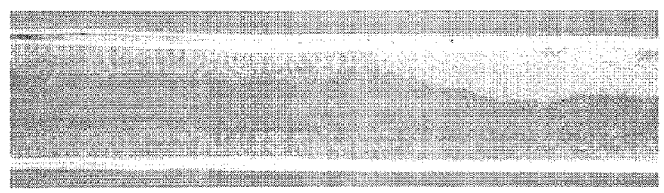
Figure 8:
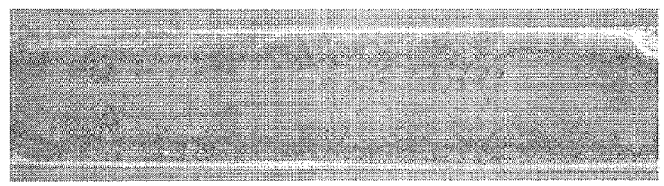

FIG. 8 illustrates a single-process transistor of the reduced graphene oxide (RGO) using the coffee-ring effect according to Example 2. It can be seen that as the temperature of the substrate is increased, the coffee-ring effect is maximized.
Evaluation 5

A current characteristic of the thin-film transistor according to Example 2 is evaluated.

Figure 9:
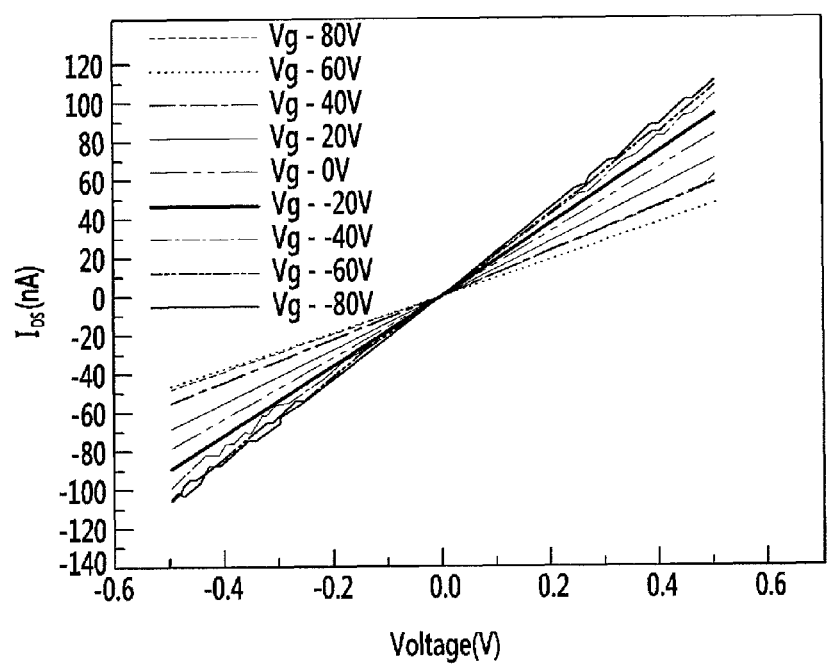
FIG. 9 is a graph exhibiting a current characteristic ($I_{DS}$-$V_{DS}$) of the thin-film transistor manufactured according to Example 2.

FIG. 9 is a graph exhibiting a current characteristic ($I_{DS}$-$V_{DS}$) of the thin-film transistor manufactured according to Example 2.

Figure 10:
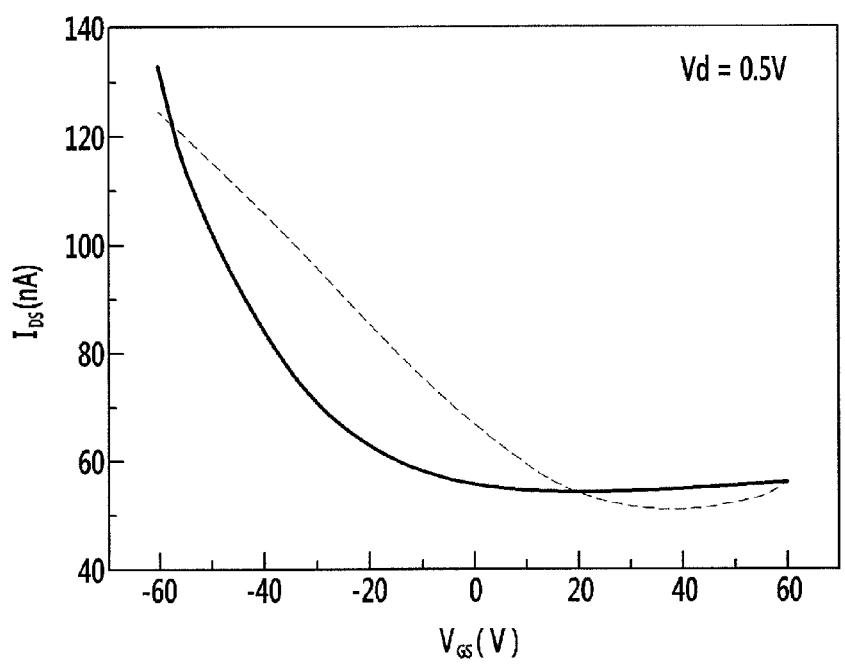
FIG. 10 is a graph exhibiting transfer characteristic (IDS-VGS) performance of the thin-film transistor manufactured according to Example 2.

FIG. 10 is a graph exhibiting transfer characteristic (IDS-VGS) performance of the thin-film transistor manufactured according to Example 2.

From the graph, it can be seen that the graphene oxide reduced using hydrazine has p-type transfer characteristic with regard to a gate voltage of of. Thus, the manufactured thin-film transistor is operated as a transistor. (Hole electric field effect mobility is 0.05 cm$^2$V$^{-1}$s$^{-1}$, on/off ratio is 2.5)

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a single-process thin-film transistor, comprising:
   preparing ink including a solution in which a graphene oxide, a reduced graphene oxide, or a combination thereof is dispersed;
   forming the ink on a substrate in the form of a pattern; and
   forming a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern.

2. The method of manufacturing a single-process thin-film transistor of claim 1, further comprising, after the forming of a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern, reducing the graphene oxide within the formed source electrode, drain electrode, and semiconductor channel.

3. The method of manufacturing a single-process thin-film transistor of claim 2, wherein, in the reducing of the graphene oxide within the formed source electrode, drain electrode, and semiconductor channel, intense pulsed light is used.

4. The method of manufacturing a single-process thin-film transistor of claim 3, wherein
the intense pulsed light has
a pulse duration of 1 msec to 500 msec.

5. The method of manufacturing a single-process thin-film transistor of claim 3, wherein
the intense pulsed light has
a pulse-off time of 0.1 msec to 500 msec.

6. The method of manufacturing a single-process thin-film transistor of claim 3, wherein
the intense pulsed light has
energy of 5 $J/cm^2$ to 200 $J/cm^2$.

7. The method of manufacturing a single-process thin-film transistor of claim 1, further comprising,
in the formed source electrode, drain electrode, and semiconductor channel,
separating and cutting the source electrode and the drain electrode.

8. The method of manufacturing a single-process thin-film transistor of claim 1, wherein,
in the preparing ink including a solution in which the graphene oxide, the reduced graphene oxide, or the combination thereof is dispersed,
the solution in which the graphene oxide, the reduced graphene oxide, or the combination thereof is dispersed includes an organic solvent, water, or a combination thereof in which the graphene oxide, the reduced graphene oxide, or the combination thereof is dispersed.

9. The method of manufacturing a single-process thin-film transistor of claim 8, wherein
the solution in which the graphene oxide, the reduced graphene oxide, or the combination thereof is dispersed includes 0.01 wt % to 3 wt % of graphene oxides, the reduced graphene oxide, or the combination thereof.

10. The method of manufacturing a single-process thin-film transistor of claim 8, wherein
the organic solvent is n-methyl pyrrolidone (NMP), dimethylpyrrolidone, ethylene glycol, acetone, tetrahydrofuran, acetonitrile, dimethylformamide, methanol, ethanol, propanol, dimethyl sulfoxide, chloroform, cyclopentanone, or a combination thereof.

11. The method of manufacturing a single-process thin-film transistor of claim 8, wherein
the organic solvent, the water, or the combination thereof includes a first solvent and a second solvent, and
the second solvent has lower viscosity and surface tension than those of the first solvent, or has higher viscosity and surface tension than those of the same.

12. The method of manufacturing a single-process thin-film transistor of claim 1, wherein,
in the forming the ink on a substrate in the form of pattern, a method of selectively controlling wettability of the solution, an inkjet printing method, or a method using a dispenser is used.

13. The method of manufacturing a single-process thin-film transistor of claim 12, wherein,
in the inkjet printing method, a volume of discharged ink is 1 µl or less.

14. The method of manufacturing a single-process thin-film transistor of claim 13, wherein,
in the inkjet printing method, a discharge volume is 1 µL or less, a discharging rate is 1 Hz to 1000 Hz, and a temperature of the substrate is 25° C. to 90° C.

15. The method of manufacturing a single-process thin-film transistor of claim 12, wherein:
the substrate includes silicon, glass, an oxide, a nitride, a plastic, or a combination thereof.

16. The method of manufacturing a single-process thin-film transistor of claim 12, wherein,
in the method of selectively controlling wettability of the solution,
the pattern is formed by allowing the ink to soak into the pattern in which a surface energy is controlled, as a result of selectively controlling surface energy on the substrate in a regular pattern form.

17. The method of manufacturing a single-process thin-film transistor of claim 1, wherein,
in the forming of a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern,
the formed source electrode and drain electrode have a thickness of 5 nm to 50 nm, and
the formed semiconductor channel has a thickness of 10 nm or less.

18. The method of manufacturing a single-process thin-film transistor of claim 17, wherein
a difference between the thickness of source electrode and drain electrode and the thickness of the semiconductor channel is 2 nm or more.

19. The method of manufacturing a single-process thin-film transistor of claim 1, wherein
a distance between the source electrode and the drain electrode is 20 µm to 200 µm.

20. The method of manufacturing a single-process thin-film transistor of claim 1, further comprising,
after the forming of a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern,
removing remaining solvent from the ink.

21. The method of manufacturing a single-process thin-film transistor of claim 1, wherein
the forming a source electrode and a drain electrode that are positioned at edges of the pattern and a semiconductor channel positioned between the electrodes by a coffee-ring effect in the ink by using the graphene oxide, the reduced graphene oxide, or the combination thereof within the formed pattern includes
increasing the coffee-ring effect by heating a substrate on which the pattern is formed to improve an evaporation rate of a solvent in the ink.

* * * * *